United States Patent
Gervais et al.

(10) Patent No.: US 10,593,409 B2
(45) Date of Patent: Mar. 17, 2020

(54) MEMORY DEVICE COMPRISING FLASH MEMORY AND METHOD FOR CONTROLLING A WRITE SPEED OF A BUS TRANSMITTING DATA FOR STORAGE ON THE FLASH MEMORY

(71) Applicant: Distech Controls Inc., Brossard (CA)

(72) Inventors: Francois Gervais, Lachine (CA); Danny Breton, Saint-Jean sur Richelieu (CA)

(73) Assignee: DISTECH CONTROLS INC., Brossard, CA (US)

( * ) Notice: Subject to any disclaimer, the term of this patent is extended or adjusted under 35 U.S.C. 154(b) by 107 days.

(21) Appl. No.: 15/782,338

(22) Filed: Oct. 12, 2017

(65) Prior Publication Data

US 2019/0115082 A1 Apr. 18, 2019

(51) Int. Cl.
*G11C 16/16* (2006.01)
*G06F 12/02* (2006.01)
*G11C 16/34* (2006.01)
*G06F 13/16* (2006.01)

(52) U.S. Cl.
CPC .......... *G11C 16/16* (2013.01); *G06F 12/0246* (2013.01); *G06F 13/1689* (2013.01); *G11C 16/3422* (2013.01); *G11C 16/3495* (2013.01); *G06F 2212/2022* (2013.01)

(58) Field of Classification Search
CPC . G11C 16/16; G11C 16/3422; G06F 12/0246; G06F 13/1689; G06F 2212/2022
See application file for complete search history.

(56) References Cited

U.S. PATENT DOCUMENTS

| | | | |
|---|---|---|---|
| 7,650,481 B2 | 1/2010 | Walker | |
| 2011/0202578 A1* | 8/2011 | Asano | G06F 12/0246 707/813 |
| 2012/0297127 A1* | 11/2012 | Belluomini | G06F 12/0866 711/103 |
| 2013/0145085 A1 | 6/2013 | Yu et al. | |
| 2014/0372678 A1 | 12/2014 | Moon et al. | |
| 2016/0117105 A1* | 4/2016 | Thangaraj | G06F 3/0616 711/103 |

OTHER PUBLICATIONS

Lee, Sungjin et al. "Lifetime management of flash-based SSDs using recovery-aware dynamic throttling." FAST (2012). (Year: 2012).*

* cited by examiner

*Primary Examiner* — Eric Cardwell
(74) *Attorney, Agent, or Firm* — RatnerPrestia

(57) ABSTRACT

Memory device comprising flash memory and method for controlling a write speed of a bus transmitting data for storage on the flash memory. The flash memory of the memory device comprises a plurality of physical blocks for writing data transmitted over the bus from a host device to the memory device. The writing of data in any one of the plurality of physical blocks is preceded by an erase of the physical block. The memory device also comprises a memory device controller controlling a write speed of the bus. The write speed of the bus defines a transmission rate at which data are transmitted over the bus from the host device to the memory device, for further writing on the flash memory. The control of the write speed of the bus comprises adapting the transmission rate based on a number of physical blocs erased.

23 Claims, 6 Drawing Sheets

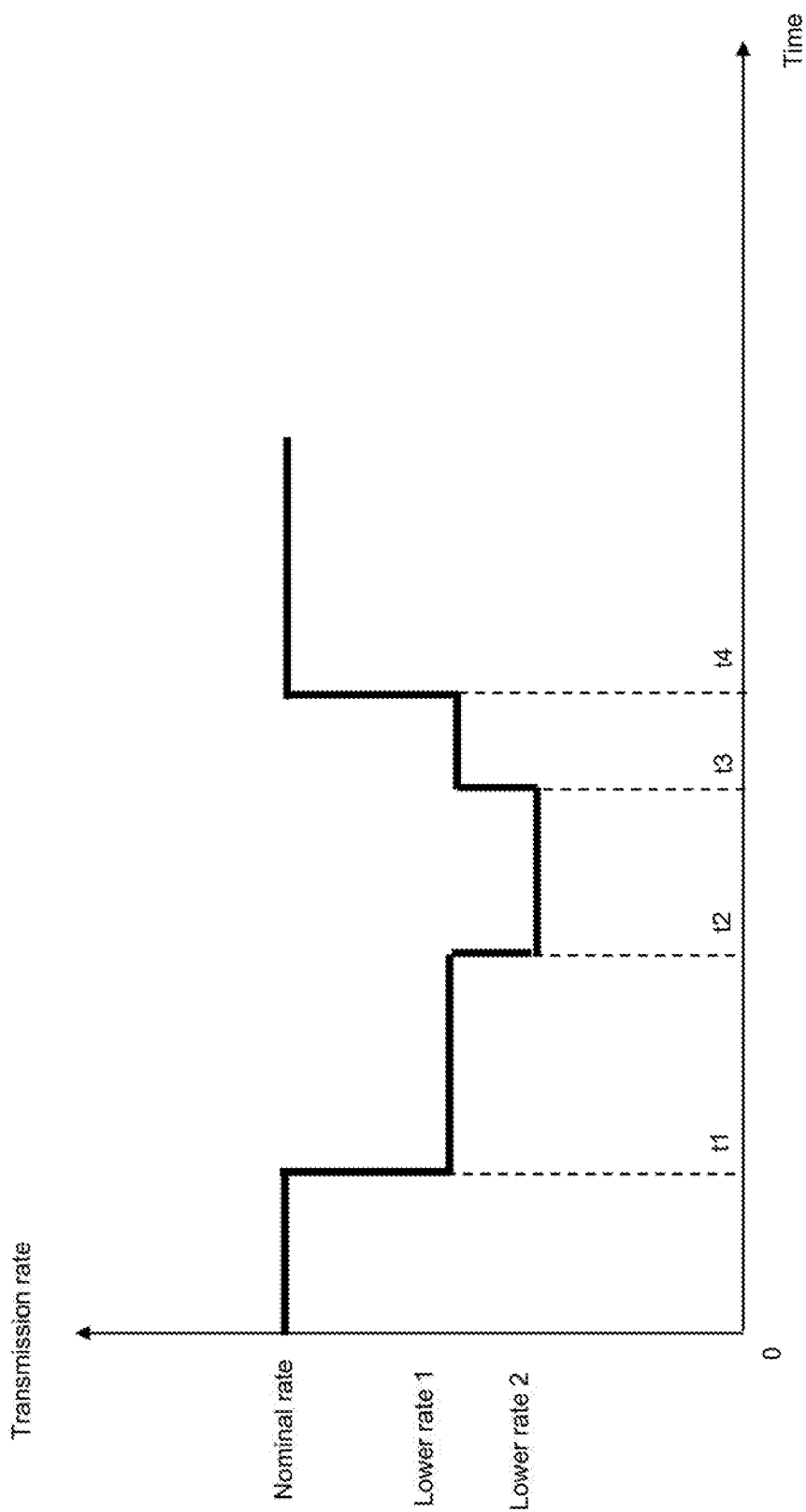

MEMORY DEVICE COMPRISING FLASH MEMORY AND METHOD FOR CONTROLLING A WRITE SPEED OF A BUS TRANSMITTING DATA FOR STORAGE ON THE FLASH MEMORY

TECHNICAL FIELD

The present disclosure relates to the field of memory devices comprising flash memory. More specifically, the present disclosure relates to a memory device comprising flash memory and a method for controlling a write speed of a bus transmitting data for storage on the flash memory.

BACKGROUND

Flash memory is a form of electrically-erasable programmable read-only memory (EEPROM) with the following characteristic: a portion of the memory is erased before data are written in the erased portion of the memory. However, a conventional EEPROM erases data on a bit-by-bit level, while a flash memory erases data on a block-by-block level. These blocks are usually referred to as physical blocks of memory, by contrast to logical blocks of memory. The size of the physical block may vary from one byte to a plurality of bytes. Thus, a physical block on a flash memory is erased before new data is written to this physical block of the flash memory. One advantage of flash memory (and more generally of EEPROM) is that it is a nonvolatile form of memory, which does not require power to preserve stored data with integrity, so that a device embedding a flash memory can be turned off without losing data.

The flash memory is weared by erase operations performed on the physical blocks of the flash memory. The manufacturer of the flash memory generally provides a life expectancy of the flash memory expressed in a limitation on the number of erase operations which can be performed. For example, the flash memory can support 10 000 erase operations on physical blocks, or the flash memory can support an average of 350 physical blocs being erased per hour for a duration of 10 years.

It is very difficult to predict how many erase operations will be performed on the memory, and when they will be performed, since it depends entirely on host device(s) (e.g. a processor) accessing the flash memory for storing data. Thus, a flash memory supporting an average of 350 physical blocs being erased per hour for a duration of 10 years may last only one or two years, if the host device(s) (e.g. a processor) accessing the flash memory generates more than 350 erase operations per hour on average (e.g. 1500 or 3000 erase operations per hour on average).

Therefore, there is a need for a new memory device comprising flash memory and a new method for controlling a write speed of a bus transmitting data for storage on the flash memory, in order to control the number of erase operations performed on the flash memory.

SUMMARY

According to a first aspect, the present disclosure provides a memory device. The memory device comprises flash memory and a memory device controller. The flash memory comprises a plurality of physical blocks for writing data transmitted over a bus from at least one host device to the memory device. The writing of data in any one of the plurality of physical blocks is preceded by an erase of the physical block. The memory device controller controls a write speed of the bus. The write speed of the bus defines a transmission rate at which data are transmitted over the bus from the at least one host device to the memory device. The control of the write speed of the bus comprises adapting the transmission rate based on a number of physical blocs erased.

According to a second aspect, the present disclosure provides a method for controlling a write speed of a bus transmitting data to a memory device comprising flash memory, the flash memory comprising a plurality of physical blocs. The method comprises determining, by a memory device controller of the memory device, a number of physical blocs erased from the flash memory. The method comprises controlling, by the memory device controller, the write speed of the bus. The write speed of the bus defines a transmission rate at which data are transmitted over the bus from at least one host device to the memory device. The control of the write speed of the bus comprises adapting the transmission rate based on the number of physical blocs erased.

According to a third aspect, the present disclosure provides a non-transitory computer program product comprising instructions executable by a memory device controller of a memory device. The memory device comprises flash memory and the flash memory comprises a plurality of physical blocs. The execution of the instructions by the memory device controller provides for controlling a write speed of a bus transmitting data to the memory device, by determining by the memory device controller a number of physical blocs erased from the flash memory, and by controlling by the memory device controller the write speed of the bus. The write speed of the bus defines a transmission rate at which data are transmitted over the bus from at least one host device to the memory device. The control of the write speed of the bus comprises adapting the transmission rate based on the number of physical blocs erased.

BRIEF DESCRIPTION OF THE DRAWINGS

Embodiments of the disclosure will be described by way of example only with reference to the accompanying drawings, in which:

FIGS. 4A and 4B illustrate the control of the write speed of the bus according to a second algorithm implementing the method of FIG. 2.

DETAILED DESCRIPTION

The foregoing and other features will become more apparent upon reading of the following non-restrictive description of illustrative embodiments thereof, given by way of example only with reference to the accompanying drawings. Like numerals represent like features on the various drawings.

Various aspects of the present disclosure generally address one or more of the problems related to the wear of flash memory embedded in a memory device. The flash memory is weared by erase operations performed on physical blocks of the flash memory. The present disclosure aims at providing a mechanism for reducing the wear of the flash memory.

Figure 1:
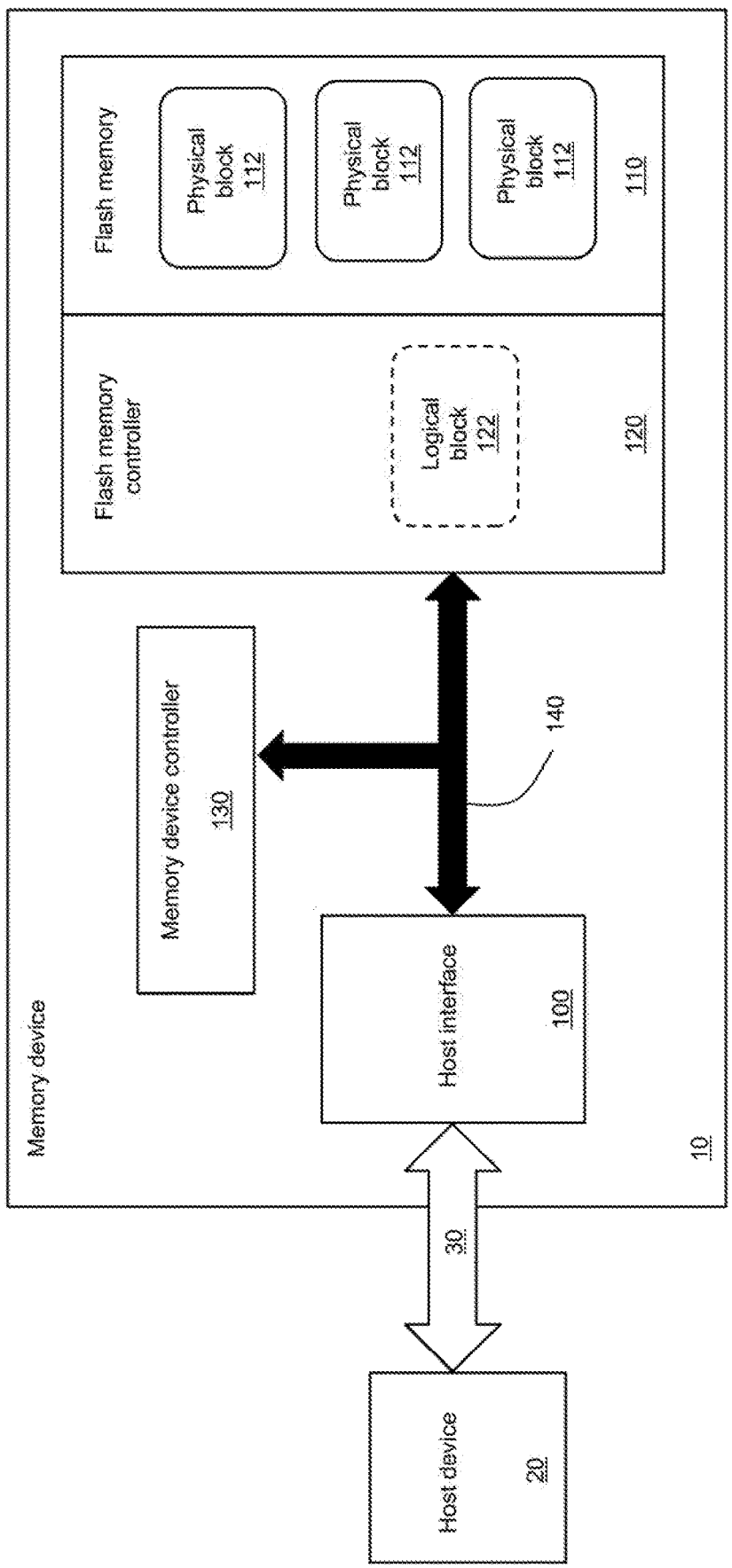
FIG. 1 is a schematic representation of a memory device comprising flash memory and a memory device controller.
Figure 2:
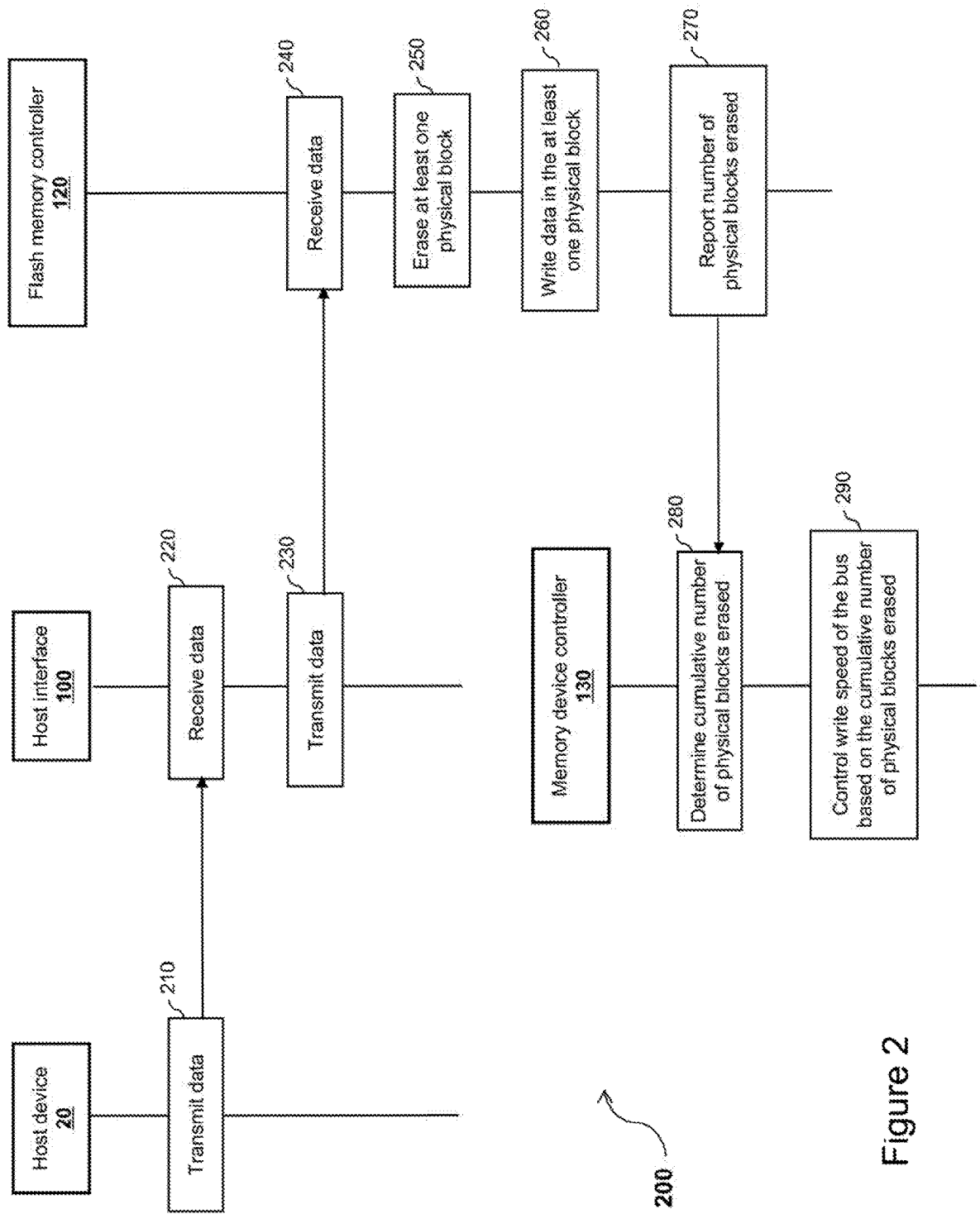
FIG. 2 represents a method for controlling a write speed of a bus transmitting data to the memory device comprising the flash memory of FIG. 1.

Referring now concurrently to FIGS. 1 and 2, a memory device 10 comprising flash memory 110, and a method 200 for controlling a write speed of a bus 30 transmitting data to the memory device 10 (for storage on the flash memory 110) are represented.

The flash memory 110 comprises a plurality of physical blocs of memory 112. Only three physical blocs 112 have been represented in FIG. 1 for simplification purposes. The number of physical blocs 112 of the flash memory 110 depends on the capacity of the flash memory 110, which is usually expressed in gigabytes (e.g. 16, 32, 64, 128, etc.). The number of physical blocs 112 of the flash memory 110 also depends on the size of the physical bloc 112, which varies from one to several bytes.

The present disclosure is not limited to flash memory, but can be extended to any form of memory operating as follows: a physical block of the memory is erased before new data is written to this physical block of the memory.

The memory device 10 also comprises a flash memory controller 120 for controlling the operations of the flash memory 110, and a host interface 100 connected to the bus 30. The memory device 10 further comprises a memory device controller 130 for controlling the operations of the memory device 10. An internal bus 140 interconnects several components of the memory device 10. For example, the internal bus 140 represented in FIG. 1 interconnects the host interface 100, the memory device controller 130 and the flash memory controller 120.

An example of memory device 10 is an embedded multimedia card (eMMC), which has an architecture similar to the one represented in FIG. 1 in terms of electronic components. However, other types of memory devices 10 (embedding the flash memory 110 and the memory device controller 130 having the capability to control a write speed on the bus 30) are also supported by the present disclosure. Furthermore, the architecture of the memory device 10 may vary. For example, the memory device controller 130 is integrated with the host interface 100, the memory device controller 130 is integrated with the flash memory controller 120, the flash memory controller 120 is integrated with the host interface 100, etc.

At least one host device 20 uses the bus 30 for writing data to (and/or reading data from) the memory device 10. Examples of host devices include: a processor, a central processing unit (CPU), a graphics processing unit (GPU), a microcontroller unit (MCU), a field-programmable gate array (FPGA), etc. A single host device 20 is represented in FIG. 1 for simplification purposes. However, a plurality of host devices (e.g. a plurality of processors) may be using the bus 30 for transmitting data to and/or receiving data from the memory device 10.

Examples of computing devices (not represented in the Figures) comprising the memory device 10 and at least one host device 20 include personal computers, laptops, tablets, smartphones, digital cameras, scientific instruments, medical devices, industrial appliances (e.g. environment controllers, sensors, controlled appliances), etc.

A write operation on the flash memory 110 is illustrated in FIG. 2, and comprises the following steps of the method 200.

At step 210, the host device 20 transmits data to be written to the memory device 10 over the bus 30.

At step 220, the host interface 100 receives the data transmitted by the host device 20 via the bus 30.

At step 230, the host interface 100 transmits the data received from the host device 20 via the bus 30 to the flash memory controller 120 over the internal bus 140.

In an alternative configuration not represented in FIG. 2, the host interface 100 transmits the data received from the host device 20 via the bus 30 to the memory device controller 130 over the internal bus 140. The memory device controller 130 performs some processing prior to effectively allowing the write operation. For instance, the memory device controller 130 determines if a write operation can be effectively performed, checks the integrity of the data, etc. Then, the memory device controller 130 transmits the data to the flash memory controller 120 over the internal bus 140.

At step 240, the flash memory controller 120 receives the data transmitted by the host interface via the internal bus 140.

At step 250, the flash memory controller 120 erases at least one physical block 112 of the flash memory 110. The number of physical blocks erased depends on the size of the physical blocks 112, and the size of the data received by the flash memory controller 120. For example, if each physical block 112 has a size of 8 bytes, and the received data have a size of 1024 bytes, then 128 physical blocs 112 are erased. The flash memory controller 120 maintains a mapping of the physical blocs 112 currently in use and available for reading by host device(s) 20. The physical blocs 112 erased at step 250 are not currently in use.

At step 260, the flash memory controller 120 writes the data received at step 240 in the at least one physical block 112 erased at step 250.

Optionally, the flash memory controller 120 comprises one or more logical blocks 122. Only one logical block 122 is represented in FIG. 1 for simplification purposes. The one or more logical blocks 122 correspond to a dedicated memory (not represented in FIG. 1) of the flash memory controller 120, where data received at step 240 are temporarily stored, before steps 250 (erase) and 260 (write) are executed. The usage of one or more logical blocks 122 is well known in the art of flash memory management, and allows an optimization of the operations of the flash memory controller 120. For example, step 240 is repeated several times, and the data received at each occurrence of step 240 are aggregated and stored in the one or more logical blocks 122. Then, steps 250 (erase) and 260 (write) are executed only once for the aggregated data stored in the one or more logical blocks 122.

At step 270, the flash memory controller 120 reports the number of physical blocks 112 erased at step 250 to the memory device controller 130. Alternatively, the flash memory controller 120 does not perform step 270 each time step 250 is performed, but reports an aggregated number of physical blocks 112 erased corresponding to several executions of step 250. Each time a physical block among the plurality of physical blocs 112 of the flash memory 110 is erased, the erase operation is reported to the memory device controller 130 at step 270.

For example, during a first instance of step 250, physical blocks B1, B2 and B3 among the plurality of physical blocs 112 of the flash memory 110 are erased. A number of 3 blocks erased is reported at step 270. During a second instance of step 250, physical blocks B2 and B5 among the plurality of physical blocs 112 of the flash memory 110 are erased. A number of 2 blocks erased is reported at step 270. During a third instance of step 250, physical blocks B1, B3, B4 and B6 among the plurality of physical blocs 112 of the flash memory 110 are erased. A number of 4 blocks erased is reported at step 270.

A control operation executed by the memory device controller 130 for controlling a write speed of the bus 30 is also illustrated in FIG. 2, and comprises the following steps of the method 200.

At step 280, the memory device controller 130 determines a cumulative number of physical blocks 112 erased. The determination is based on the number of physical blocks 112 erased which are reported by the flash memory controller 120 at step 270. Each time step 270 is executed, the number of physical blocks 112 erased which are reported at step 270 is added to the cumulative number of physical blocks 112 erased. At some point, the memory device controller 130 may reset the cumulative number of physical blocks 112 erased and initiate a new calculation starting from 0. A period of time or a time interval during which the cumulative number of physical blocks 112 erased is calculated is defined, and depends on an algorithm implemented by the memory device controller 130, as will be illustrated later in the description.

For example, reference is made to the previous example with the assumption that the cumulative number of physical blocks 112 erased has just been set to 0. During the first instance of step 250, a number of 3 blocks erased is reported at step 270. The cumulative number of physical blocks 112 erased is updated to 3 at step 280. During the second instance of step 250, a number of 2 blocks erased is reported at step 270. The cumulative number of physical blocks 112 erased is updated to 5 at step 280. During the third instance of step 250, a number of 4 blocks erased is reported at step 270. The cumulative number of physical blocks 112 erased is updated to 9 at step 280.

At step 290, the memory device controller 130 controls the write speed of the bus 30 based on the cumulative number of physical blocks 112 erased which has been determined at step 280. As mentioned previously, the write speed of the bus 30 determines the speed at which data are transmitted from the host device(s) 20 to the memory device 10 over the bus 30, to be further written on the flash memory 110. For example, the bus 30 operates at a nominal write speed (e.g. 20 Mbits/s). When the cumulative number of physical blocks 112 erased reaches a threshold, the memory device controller 130 sets the write speed of the bus 30 to a value (e.g. 15 Mbits/s) lower than its nominal write speed. Various algorithms can be implemented by the memory device controller 130 for controlling the write speed of the bus 30 based on the cumulative number of physical blocks 112 erased, as will be illustrated later in the description.

From an implementation perspective, the memory device controller 130 sends a command over the internal bus 140 to the host interface 100. The command comprises the new write speed of the bus 30. The host interface 100 effectively programs the bus 30 to operate at the new write speed. At any time, the memory device controller 130 may also send a request over the internal bus 140 to the host interface 100, to ask the current write speed of the bus 30. In response to the request, the host interface 100 transmits the current write speed of the bus 30 over the internal bus 140 to the memory device controller 130. The exact implementation of step 290 in terms of interactions between the memory device controller 130 and the host interface 100 may vary, based on various implementations of the memory device 10.

The consequence of reducing the transmission rate of the bus 30 at determined periods of utilization of the bus 30 has the consequence of reducing the amount of data transmitted during these determined periods, which in turn reduces the number of erase operations performed on the physical blocks 112. As mentioned earlier, reducing the number of erase operations performed on the physical blocks 112 reduces the wear of the flash memory 110 and extends (or at least preserve) its life expectancy.

The read speed of the bus 30 is not affected by the present method 200. The read speed of the bus 30 determines the speed at which data (read from the flash memory 110) are transmitted from to the memory device 10 to the host device(s) 20 over the bus 30. Thus, the bus 30 can operate at its full potential in terms of read speed, while its write speed may be downgraded based on the value of the cumulative number of physical blocks 112 erased.

The memory device controller 130, the flash memory controller 120 and optionally the host interface 100 are electronic devices comprising a processing unit capable of executing instructions of a software program. The memory device controller 130, the flash memory 120 (and optionally the host interface 100) also include internal memory for storing instructions of the software programs executed by these electronic devices, data received from other entities of the memory device 10 via the internal bus 140, data generated by the software programs, etc. Alternatively, a stand-alone memory (e.g. the flash memory 110, or another dedicated memory not represented in FIG. 1) is included in the memory device 10 for storing the software programs executed by at least one of the memory device controller 130 and the flash memory controller 120, data received and generated by at least one of the memory device controller 130 and the flash memory controller 120. For instance, the memory device controller 130 and the flash memory controller 120 consist of microcontroller units (MCU), which are well known in the art of electronics.

The memory device controller 130 executes instructions of a software program implementing the steps of the method 200 executed by the memory device controller 130. The flash memory controller 120 executes instructions of a software program implementing the steps of the method 200 executed by the flash memory controller 120.

An internal memory of the memory device controller 130 or the flash memory controller 120, a standalone memory of the memory device 10, are examples of a non-transitory computer program product adapted for storing instructions of the software programs executed by the memory device controller 130 or the flash memory controller 120.

Alternatively, at least some of the memory device controller 130, the flash memory controller 120 and the host interface 100 are pure hardware components, such as a field-programmable gate array (FPGA). For example, the host interface 100 performs simple operations and can be more cost-effectively implemented by a FPGA.

Referring now concurrently to FIGS. 1, 2, 3A and 3B, a first algorithm implemented by the memory device controller 130 for controlling the write speed of the bus 30 based on the cumulative number of physical blocks 112 erased is illustrated. This first algorithm implements steps 280 and 290 of the method 200.

The write speed of the bus 30 defines a transmission rate at which data are transmitted over the bus 30 from the host device(s) 20 to the memory device 10. The control of the write speed of the bus 30 performed at step 290 comprises adapting the transmission rate based on the cumulative number of physical blocs 112 erased which is determined at step 280. In the rest of the description, the transmission rate will always refer to a transmission of data over the bus 30 from the host device(s) 20 to the memory device 10, for the purpose of performing a write operation on the flash memory 110.

With the first algorithm, the transmission rate is lowered if the cumulative number of physical blocs 112 erased reaches a threshold over a period of time.

The bus 30 operates at a nominal transmission rate (e.g. 20 Mbits/s) if the cumulative number of memory blocs 112 erased from the flash memory 110 remains below the threshold over the period of time. The duration of the period of time may vary. For exemplary purposes, we define a period of time of one hour. Thus, at each hour, the cumulative number of physical blocs 112 erased is reset, and it is then incremented at step 280 over the current hour based on the reports transmitted at step 270 by the flash memory controller 120. For exemplary purposes, we define a threshold of 350 physical blocs 112 erased over the period of time (e.g. one hour). During the current period of time (e.g. the current hour), as long as the cumulative number of memory blocs 112 erased remains below the threshold (e.g. 350), the bus 30 operates at its nominal transmission rate (e.g. 20 Mbits/s).

The memory device controller 130 sets the transmission rate at a transmission rate value (e.g. 17 Mbits/s) lower than the nominal transmission rate (e.g. 20 Mbits/s) if the cumulative number of memory blocs 112 erased reaches the threshold (e.g. 350) over the current period of time (e.g. the current hour). Once the transmission rate is degraded to the lower value (e.g. 17 Mbits/s), it remains at this value for the remaining of the current period of time (e.g. the current hour). At the end of the current period of time, the transmission rate is restored (by the memory device controller 130) to its nominal value (e.g. 20 Mbits/s) if it has been degraded to the lower value (e.g. 17 Mbits/s). A new cycle similar to the one previously described starts with the new period of time (e.g. new hour).

Figure 3A:
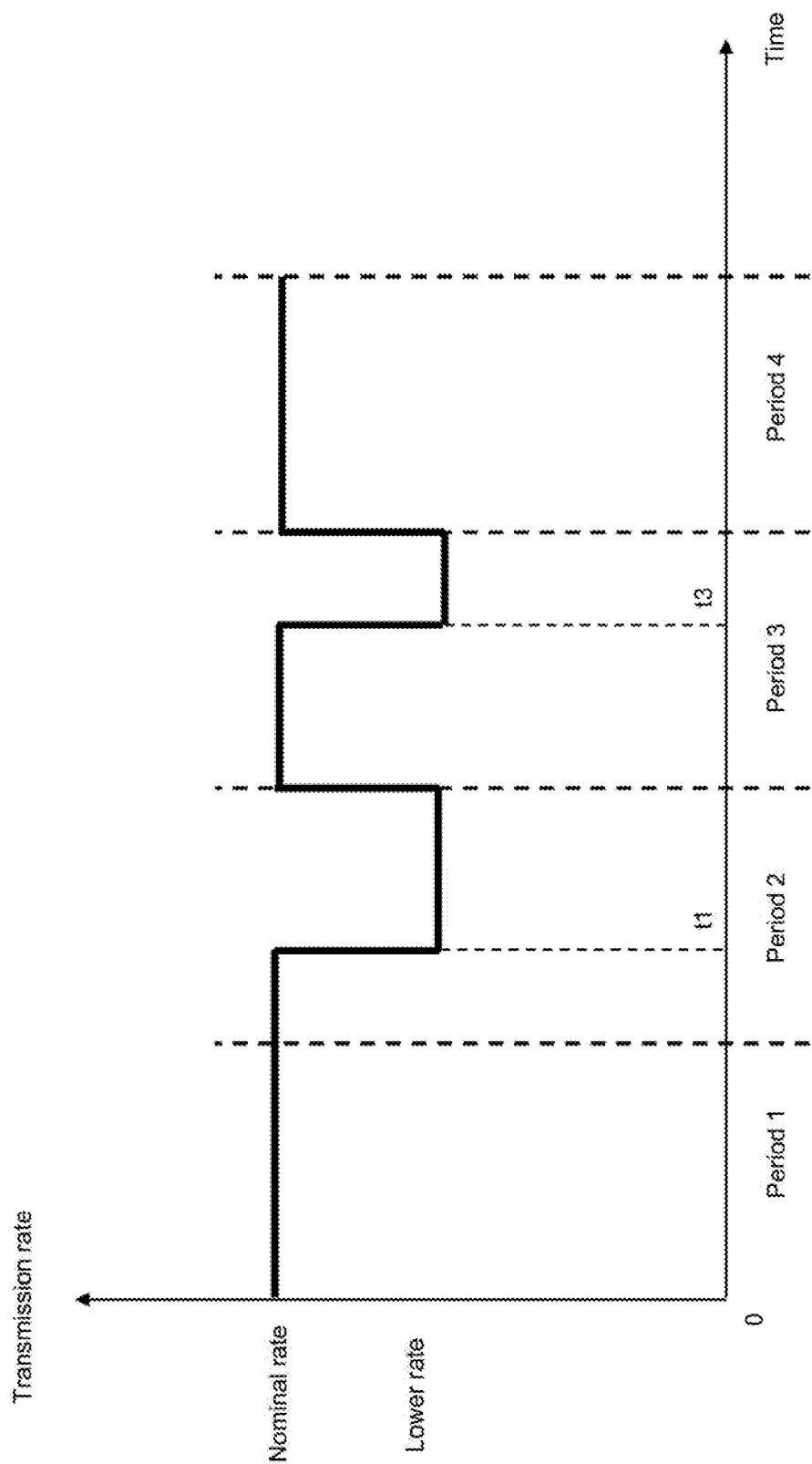
FIGS. 3A and 3B illustrate the control of the write speed of the bus according to a first algorithm implementing the method of FIG. 2.

FIG. 3A illustrates four consecutive periods of time. At the beginning of the first period of time, the bus 30 operates at its nominal transmission rate (e.g. 20 Mbits/s) and remains operating at is nominal transmission rate (the cumulative number of memory blocs 112 erased remains below the threshold (e.g. 350) during the first period of time).

At the beginning of the second period of time, the bus 30 operates at its nominal transmission rate (e.g. 20 Mbits/s). The bus 30 is set to operate at the lower transmission rate (e.g. 17 Mbits/s) at time t1 inside the second period of time, because the cumulative number of memory blocs 112 erased reaches the threshold (e.g. 350) at time t1. From time t1 to the end of the second period of time, the bus 30 operates at the lower transmission rate (e.g. 17 Mbits/s).

At the beginning of the third period of time, the bus 30 is reset to operate at its nominal transmission rate (e.g. 20 Mbits/s). The bus 30 is then set to operate at the lower transmission rate (e.g. 17 Mbits/s) at time t3 inside the third period of time, because the cumulative number of memory blocs 112 erased reaches the threshold (e.g. 350) at time t3. From time t3 to the end of the third period of time, the bus 30 operates at the lower transmission rate (e.g. 17 Mbits/s).

At the beginning of the fourth period of time, the bus 30 is reset to operate at its nominal transmission rate (e.g. 20 Mbits/s). The bus 30 remains operating at is nominal transmission rate, because the cumulative number of memory blocs 112 erased remains below the threshold (e.g. 350) during the fourth period of time.

If the bus 30 is configured to operate at the lower transmission rate (e.g. 17 Mbits/s) during a period of time, the memory device controller 130 no longer needs to perform steps 280 and 290 of the method 200 until the beginning of the next period of time.

The duration of the period of time, the value of the threshold and the lower value for the transmission rate are three parameters of the first algorithm implemented by the memory device controller 130. These three parameters can be configured by an entity external to the memory device 10 (e.g. the host device 20), and stored by the memory device controller 130. At least one of these three parameters can be updated, to adapt the execution of the first algorithm to new operating conditions.

A modified version of the first algorithm consists in defining several corresponding values for respectively the value of the threshold and the lower value for the transmission rate. For example, with two sets of values for these two parameters, the first algorithm is modified as follows.

The bus 30 operates at the nominal transmission rate (e.g. 20 Mbits/s) if the cumulative number of memory blocs 112 erased from the flash memory 110 remains below a first threshold (e.g. 350) over the period of time (e.g. one hour). During the current period of time (e.g. the current hour), as long as the cumulative number of memory blocs 112 erased remains below the first threshold (e.g. 350), the bus 30 operates at its nominal transmission rate (e.g. 20 Mbits/s).

The memory device controller 130 sets the transmission rate at a first lower transmission rate value (e.g. 17 Mbits/s) lower than the nominal transmission rate (e.g. 20 Mbits/s) if the cumulative number of memory blocs 112 erased reaches the first threshold (e.g. 350) over the current period of time (e.g. the current hour). Once the transmission rate is degraded to the first lower transmission rate (e.g. 17 Mbits/s), it remains at this value for the remaining of the current period of time (e.g. the current hour), unless a second threshold is reached.

The memory device controller 130 sets the transmission rate at a second lower transmission rate value (e.g. 15 Mbits/s) lower than the first lower transmission rate (e.g. 17 Mbits/s) if the cumulative number of memory blocs 112 erased reaches the second threshold (e.g. 400) over the current period of time (e.g. the current hour). The second threshold (e.g. 400) is higher than the first threshold (e.g. 350). Once the transmission rate is degraded to the second lower transmission rate (e.g. 15 Mbits/s), it remains at this value for the remaining of the current period of time (e.g. the current hour). At the end of the current period of time, the transmission rate is restored (by the memory device controller 130) to its nominal value (e.g. 20 Mbits/s) if it has been downgraded (to 17 Mbits/s or 15 Mbits/s) during the current period of time. A new cycle similar to the one previously described starts with the new period of time (e.g. the new hour).

If the bus 30 is configured to operate at the lowest transmission rate value (e.g. 15 Mbits/s) during a period of time, the memory device controller 130 no longer needs to perform steps 280 and 290 of the method 200 until the beginning of the next period of time.

Figure 3B:
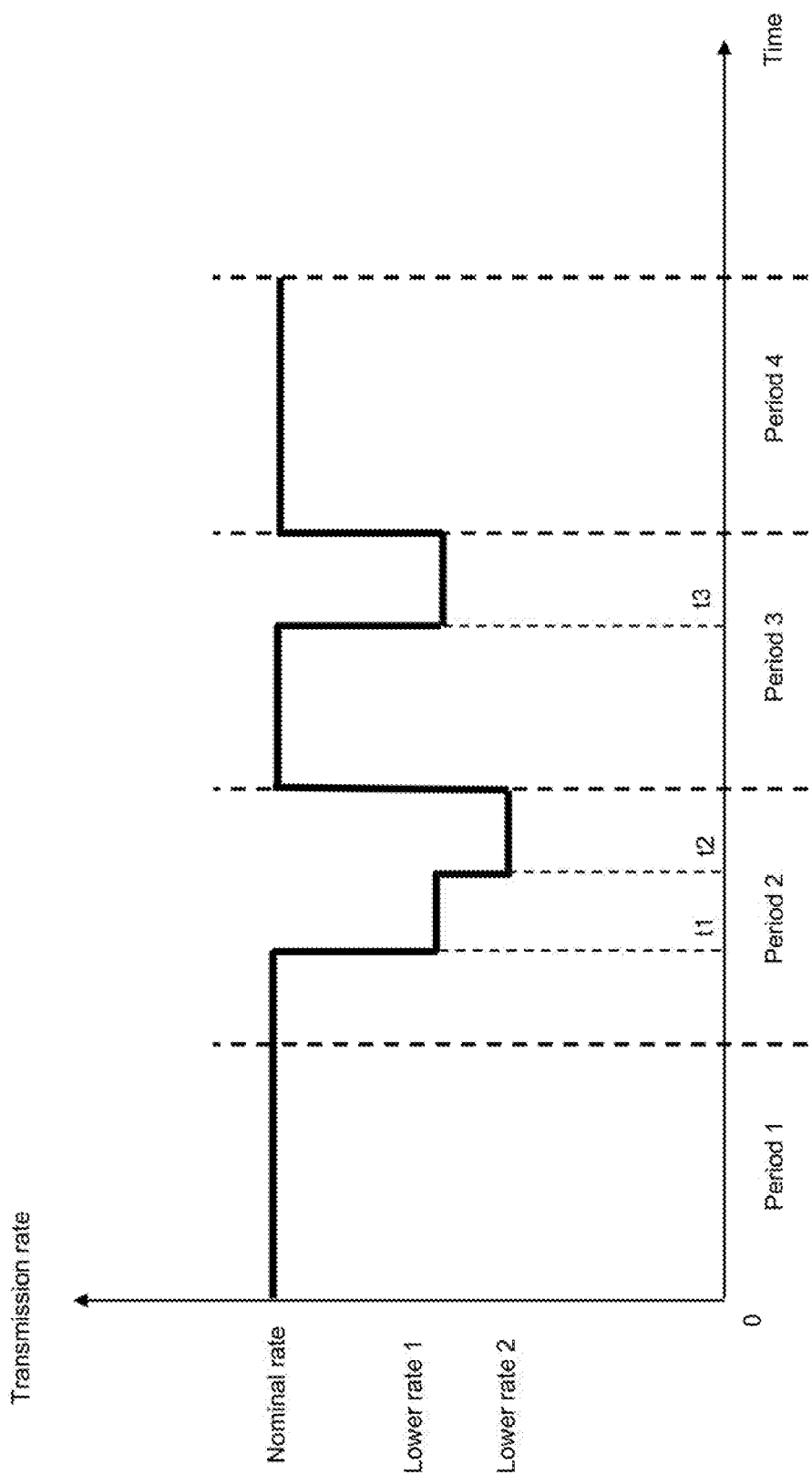

FIG. 3B illustrates the modified version of the first algorithm using two threshold values and two corresponding downgraded transmission rate values. In FIG. 3B, the modified first algorithm operates in a manner similar to the first algorithm illustrated in FIG. 3A, except for the second period of time.

At the beginning of the second period of time, the bus 30 is reset to operate at its nominal transmission rate (e.g. 20 Mbits/s). The bus is then set to operate at the first lower transmission rate (e.g. 17 Mbits/s) at time t1 inside the second period of time, because the cumulative number of memory blocs 112 erased reaches the first threshold (e.g. 350) at time t1, but is lower than the second threshold (e.g.

400). From time t1 to a time t2, the bus 30 operates at the first lower transmission rate (e.g. 17 Mbits/s). The bus 30 is set to operate at the second lower transmission rate (e.g. 15 Mbits/s) at time t2 inside the second period of time, because the cumulative number of memory blocs 112 erased reaches the second threshold (e.g. 400) at time t2. From time t2 to the end of the second period of time, the bus 30 operates at the second lower transmission rate (e.g. 15 Mbits/s).

A person skilled in the art would readily understand that the present first algorithm can be adapted at will, with any number of threshold values and corresponding downgraded transmission rate values. The threshold values increase while the corresponding downgraded transmission rates decrease.

Referring now concurrently to FIGS. 1, 2, 4A and 4B, a second algorithm implemented by the memory device controller 130 for controlling the write speed of the bus 30 based on the cumulative number of physical blocks 112 erased is illustrated. This second algorithm implements steps 280 and 290 of the method 200. The control of the write speed of the bus 30 performed at step 290 comprises adapting the transmission rate based on the cumulative number of physical blocs 112 erased which is determined at step 280.

With the second algorithm, the transmission rate is dynamically adapted, based on a comparison with a threshold of the cumulative number of physical blocs 112 erased during a time interval. The duration T of the time interval is a parameter of the second algorithm, and its value may vary. For example, the time interval has a duration T of one hour.

Step 280 occurs at instant t, upon reception of a report transmitted at step 270 by the flash memory controller 120. The memory device controller 130 calculates the cumulative number of physical blocs 112 erased during the time interval, from instant t−T to instant t. The calculation takes into consideration all the reports transmitted at step 270 by the flash memory controller 120 between instant t−T and instant t.

The memory device controller 130 configures the bus 30 to operate at a nominal transmission rate (e.g. 20 Mbits/s) if the cumulative number of memory blocs 112 erased from the flash memory 110 during the time interval [t−T,t] is lower than the threshold. For exemplary purposes, we define a threshold of 350 physical blocs 112 erased during the time interval of duration T (e.g. one hour).

The memory device controller 130 configures the bus 30 to operate at a transmission rate value (e.g. 17 Mbits/s) lower than the nominal transmission rate (e.g. 20 Mbits/s) if the cumulative number of memory blocs 112 erased from the flash memory 110 during the time interval [t−T,t] is higher than the threshold (e.g. 350).

Figure 4A:
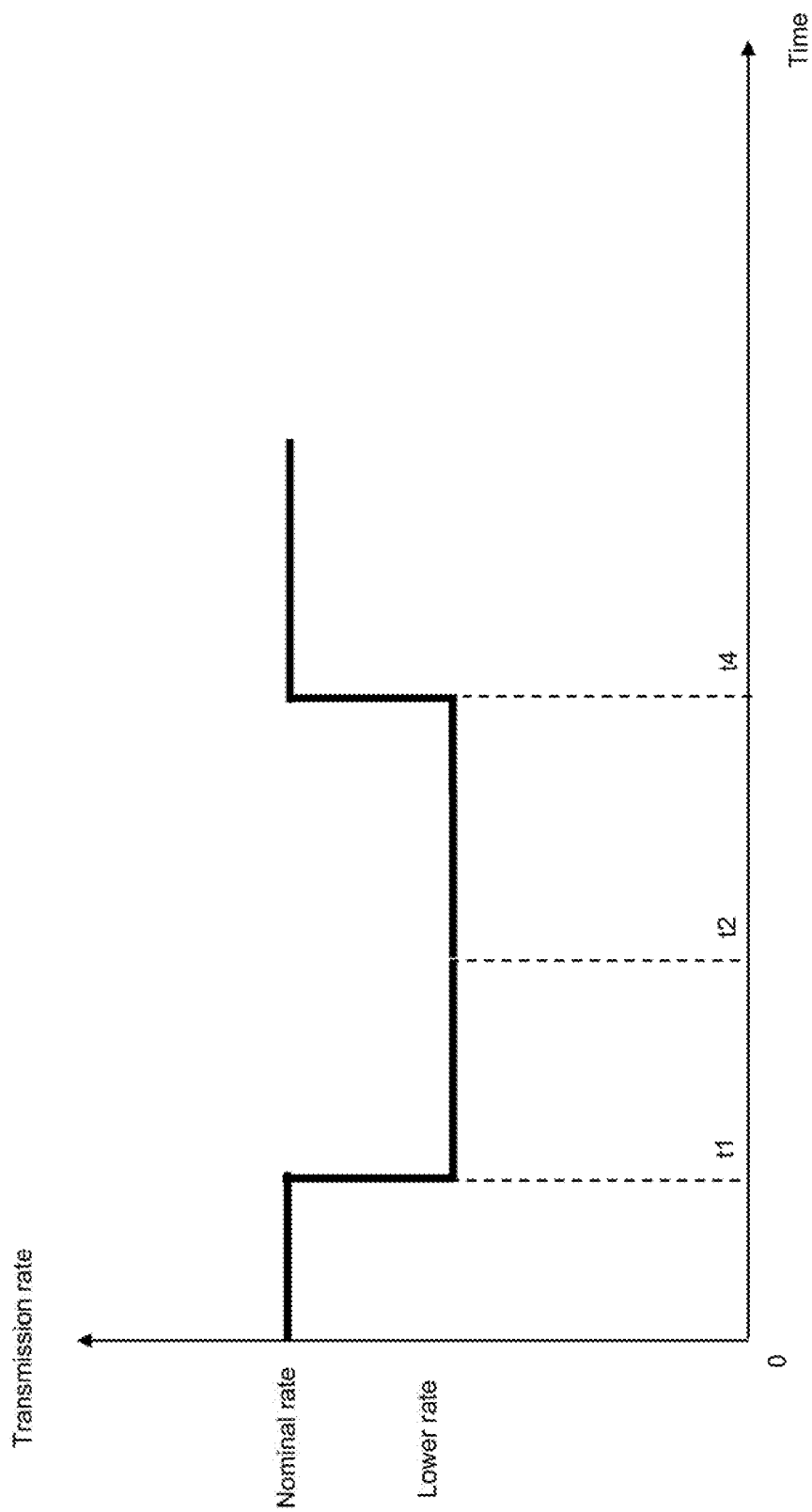

FIG. 4A illustrates how the second algorithm operates over a period of time. At the beginning of the period of time (t=0), the bus 30 operates at its nominal transmission rate (e.g. 20 Mbits/s).

At instant t=t1, a report transmitted at step 270 by the flash memory controller 120 is received by the memory device controller 130, and the cumulative number of memory blocs 112 erased from the flash memory 110 during the time interval [t1−T,t1] is calculated at step 280. At step 290, the memory device controller 130 configures the bus 30 to operate at the lower transmission rate (e.g. 17 Mbits/s) because the calculated cumulative number of memory blocs 112 erased is determined to be higher than the threshold (e.g. 350).

At instant t=t2, a new report transmitted at step 270 by the flash memory controller 120 is received by the memory device controller 130, and the cumulative number of memory blocs 112 erased from the flash memory 110 during the time interval [t2−T,t2] is calculated at step 280. At step 290, the memory device controller 130 leaves the bus 30 operating at the lower transmission rate (e.g. 17 Mbits/s) because the calculated cumulative number of memory blocs 112 erased is (again) determined to be higher than the threshold (e.g. 350).

At instant t=t4, a new report transmitted at step 270 by the flash memory controller 120 is received by the memory device controller 130, and the cumulative number of memory blocs 112 erased from the flash memory 110 during the time interval [t4−T,t4] is calculated at step 280. At step 290, the memory device controller 130 configures the bus 30 to operate at the nominal transmission rate (e.g. 20 Mbits/s) because the calculated cumulative number of memory blocs 112 erased is now determined to be lower than the threshold (e.g. 350).

The duration T of the time interval, the value of the threshold and the lower value for the transmission rate are three parameters of the second algorithm implemented by the memory device controller 130. These three parameters can be configured by an entity external to the memory device 10 (e.g. the host device 20), and stored by the memory device controller 130. At least one of these three parameters can be updated, to adapt the execution of the second algorithm to new operating conditions.

A modified version of the second algorithm consists in defining several corresponding values for respectively the value of the threshold and the lower value for the transmission rate. For example, with two sets of values for these two parameters, the second algorithm is modified as follows.

The memory device controller 130 configures the bus 30 to operate at a nominal transmission rate (e.g. 20 Mbits/s) if the cumulative number of memory blocs 112 erased from the flash memory 110 during the time interval [t−T,t] is lower than a first threshold (e.g. 350).

The memory device controller 130 configures the bus 30 to operate at a first transmission rate value (e.g. 17 Mbits/s) lower than the nominal transmission rate (e.g. 20 Mbits/s) if the cumulative number of memory blocs 112 erased from the flash memory 110 during the time interval [t−T,t] is higher than the first threshold (e.g. 350) and lower than a second threshold (e.g. 400). The second threshold (e.g. 400) is higher than the first threshold (e.g. 350).

The memory device controller 130 configures the bus 30 to operate at a second transmission rate value (e.g. 15 Mbits/s) lower than the first transmission rate (e.g. 17 Mbits/s) if the cumulative number of memory blocs 112 erased from the flash memory 110 during the time interval [t−T,t] is higher than the second threshold (e.g. 400).

FIG. 4B illustrates the modified version of the second algorithm using two threshold values and two corresponding downgraded transmission rate values. At the beginning of the period of time (t=0), the bus 30 operates at its nominal transmission rate (e.g. 20 Mbits/s).

At instant t=t1, a report transmitted at step 270 by the flash memory controller 120 is received by the memory device controller 130, and the cumulative number of memory blocs 112 erased from the flash memory 110 during the time interval [t1−T,t1] is calculated at step 280. At step 290, the memory device controller 130 configures the bus 30 to operate at the first lower transmission rate (e.g. 17 Mbits/s) because the calculated cumulative number of memory blocs 112 erased is determined to be higher than the first threshold (e.g. 350), but lower than the second threshold (e.g. 400).

At instant t=t2, a new report transmitted at step 270 by the flash memory controller 120 is received by the memory device controller 130, and the cumulative number of memory blocs 112 erased from the flash memory 110 during the time interval [t2−T,t4] is calculated at step 280. At step 290, the memory device controller 130 configures the bus 30 to operate at the second lower transmission rate (e.g. 15 Mbits/s) because the calculated cumulative number of memory blocs 112 erased is determined to be higher than the second threshold (e.g. 400).

At instant t=t3, a report transmitted at step 270 by the flash memory controller 120 is received by the memory device controller 130, and the cumulative number of memory blocs 112 erased from the flash memory 110 during the time interval [t3−T,t3] is calculated at step 280. At step 290, the memory device controller 130 configures the bus 30 to operate at the first lower transmission rate (e.g. 17 Mbits/s) because the calculated cumulative number of memory blocs 112 erased is determined to be higher than the first threshold (e.g. 350), but lower than the second threshold (e.g. 400).

At instant t=t4, a new report transmitted at step 270 by the flash memory controller 120 is received by the memory device controller 130, and the cumulative number of memory blocs 112 erased from the flash memory 110 during the time interval [t4−T,t4] is calculated at step 280. At step 290, the memory device controller 130 configures the bus 30 to operate at the nominal transmission rate (e.g. 20 Mbits/s) because the calculated cumulative number of memory blocs 112 erased is now determined to be lower than the first threshold (e.g. 350).

A person skilled in the art would readily understand that the present second algorithm can be adapted at will, with any number of threshold values and corresponding downgraded transmission rate values. The threshold values increase while the corresponding downgraded transmission rates decrease.

Although the present disclosure has been described hereinabove by way of non-restrictive, illustrative embodiments thereof, these embodiments may be modified at will within the scope of the appended claims without departing from the spirit and nature of the present disclosure.

What is claimed is:

1. A memory device comprising:
   flash memory comprising a plurality of physical blocks for writing data transmitted over a bus from at least one host device to the memory device, the writing of data in any one of the plurality of physical blocks being preceded by an erase of the physical block; and
   a memory device controller controlling a write speed of the bus, the write speed of the bus defining a transmission rate at which data are transmitted over the bus from the at least one host device to the memory device, the control of the write speed of the bus comprising:
   setting a cumulative number of physical blocks previously erased from the flash memory to 0 at the beginning of a time interval;
   determining the cumulative number of physical blocks previously erased from the flash memory during the time interval;
   adapting the transmission rate at which data are transmitted over the bus from the at least one host device to the memory device based on the cumulative number of physical blocks previously erased from the flash memory during the time interval; and
   resetting the cumulative number of physical blocks previously erased from the flash memory to 0 at the end of the time interval.

2. The system of claim 1, wherein the memory device comprises a flash memory controller for erasing the physical blocks, writing data in the physical blocks, counting the number of physical blocks erased and transmitting the count of physical blocks erased to the memory device controller, the determination of the cumulative number of physical blocks previously erased from the flash memory comprising incrementing the cumulative number of physical blocks previously erased from the flash memory by the count of physical blocks erased transmitted by the flash memory controller to the memory device controller.

3. The system of claim 1, wherein adapting the transmission rate based on a cumulative number of physical blocks previously erased comprises lowering the transmission rate if the cumulative number of physical blocks previously erased reaches a threshold over a period of time.

4. The system of claim 3, wherein the bus operates at a nominal transmission rate if the cumulative number of memory blocks previously erased from the flash memory remains below the threshold over the period of time, and the memory device controller sets the transmission rate at a transmission rate value lower than the nominal transmission rate if the cumulative number of memory blocks previously erased from the flash memory reaches the threshold over the period of time.

5. The system of claim 3, wherein the bus operates at a nominal transmission rate if the cumulative number of memory blocks previously erased from the flash memory remains below a first threshold over the period of time, the memory device controller sets the transmission rate at a first transmission rate value lower than the nominal transmission rate if the cumulative number of memory blocks previously erased from the flash memory reaches the first threshold over the period of time, and the memory device controller sets the transmission rate at a second transmission rate value lower than the first transmission rate value if the cumulative number of memory blocks previously erased from the flash memory reaches a second threshold higher than the first threshold over the period of time.

6. The system of claim 1, wherein adapting the transmission rate based on a cumulative number of physical blocks previously erased comprises: configuring by the memory device controller the bus to operate at a nominal transmission rate if the cumulative number of memory blocks previously erased from the flash memory during the time interval is lower than a threshold, and configuring by the memory device controller the bus to operate at a transmission rate value lower than the nominal transmission rate if the cumulative number of memory blocks previously erased from the flash memory during the time interval is higher than the threshold.

7. The system of claim 1, wherein adapting the transmission rate based on a cumulative number of physical blocks previously erased comprises: configuring by the memory device controller the bus to operate at a nominal transmission rate if the cumulative number of memory blocks previously erased from the flash memory during the time interval is lower than a first threshold, configuring by the memory device controller the bus to operate at a first transmission rate value lower than the nominal transmission rate if the cumulative number of memory blocks previously erased from the flash memory during the time interval is between the first threshold and a second threshold higher than the first threshold, configuring by the memory device controller the bus to operate at a second transmission rate value lower than the first transmission rate value if the cumulative number of memory blocks previously erased from the flash memory during the time interval is higher than the second threshold.

8. A method for controlling a write speed of a bus transmitting data to a memory device comprising flash memory, the flash memory comprising a plurality of physical blocks, the method comprising:
(a) setting by a memory device controller of the memory device a cumulative number of physical blocks previously erased from the flash memory to 0 at the beginning of a time interval;
(b) determining by a memory device controller of the memory device the cumulative number of physical blocks previously erased from the flash memory during the time interval;
(c) controlling by the memory device controller the write speed of the bus, the write speed of the bus defining a transmission rate at which data are transmitted over the bus from at least one host device to the memory device, the control of the write speed of the bus comprising adapting the transmission rate at which data are transmitted over the bus from the at least one host device to the memory device based on the cumulative number of physical blocks previously erased from the flash memory during the time interval; and
(d) resetting by the memory device controller of the memory device the cumulative number of physical blocks previously erased from the flash memory to 0 at the end of the time interval.

9. The method of claim 8, further comprising writing by a flash memory controller of the memory device the data transmitted over the bus from the at least one host device to the memory device in at least one of the plurality of physical blocks of the flash memory, the writing of data in any one of the plurality of physical blocks of the flash memory being preceded by an erase of the physical block; and further comprising counting the number of physical blocks erased by the flash memory controller and transmitting by the flash memory controller the count of physical blocks erased to the memory device controller, the determination of the cumulative number of physical blocks previously erased from the flash memory comprising incrementing the cumulative number of physical blocks previously erased from the flash memory by the count of physical blocks erased transmitted by the flash memory controller to the memory device controller.

10. The method of claim 8, wherein adapting the transmission rate based on a cumulative number of physical blocks previously erased comprises lowering the transmission rate if the cumulative number of physical blocks previously erased reaches a threshold over a period of time.

11. The method of claim 10, wherein the bus operates at a nominal transmission rate if the cumulative number of memory blocks previously erased from the flash memory remains below the threshold over the period of time, and the memory device controller sets the transmission rate at a transmission rate value lower than the nominal transmission rate if the cumulative number of memory blocks previously erased from the flash memory reaches the threshold over the period of time.

12. The method of claim 10, wherein the bus operates at a nominal transmission rate if the cumulative number of memory blocks previously erased from the flash memory remains below a first threshold over the period of time, the memory device controller sets the transmission rate at a first transmission rate value lower than the nominal transmission rate if the cumulative number of memory blocks previously erased from the flash memory reaches the first threshold over the period of time, and the memory device controller sets the transmission rate at a second transmission rate value lower than the first transmission rate value if the cumulative number of memory blocks previously erased from the flash memory reaches a second threshold higher than the first threshold over the period of time.

13. The method of claim 8, wherein adapting the transmission rate based on a cumulative number of physical blocks previously erased comprises: configuring by the memory device controller the bus to operate at a nominal transmission rate if the cumulative number of memory blocks previously erased from the flash memory during the time interval is lower than a threshold, and configuring by the memory device controller the bus to operate at a transmission rate value lower than the nominal transmission rate if the cumulative number of memory blocks previously erased from the flash memory during the time interval is higher than the threshold.

14. The method of claim 8, wherein adapting the transmission rate based on a cumulative number of physical blocks previously erased comprises: configuring by the memory device controller the bus to operate at a nominal transmission rate if the cumulative number of memory blocks previously erased from the flash memory during the time interval is lower than a first threshold, configuring by the memory device controller the bus to operate at a first transmission rate value lower than the nominal transmission rate if the cumulative number of memory blocks previously erased from the flash memory during the time interval is between the first threshold and a second threshold higher than the first threshold, and configuring by the memory device controller the bus to operate at a second transmission rate value lower than the first transmission rate value if the cumulative number of memory blocks previously erased from the flash memory during the time interval is higher than the second threshold.

15. The method of claim 8, wherein steps (b), (c) and (d) are repeated over a plurality of consecutive time intervals.

16. A non-transitory computer program product comprising instructions executable by a memory device controller of a memory device comprising flash memory, the flash memory comprising a plurality of physical blocks, the execution of the instructions by the memory device controller providing for controlling a write speed of a bus transmitting data to the memory device by:
(a) setting by the memory device controller of the memory device a cumulative number of physical blocks previously erased from the flash memory to 0 at the beginning of a time interval;
(b) determining by the memory device controller a cumulative number of physical blocks previously erased from the flash memory during the time interval;
(c) controlling by the memory device controller the write speed of the bus, the write speed of the bus defining a transmission rate at which data are transmitted over the bus from at least one host device to the memory device, the control of the write speed of the bus comprising adapting the transmission rate at which data are transmitted over the bus from the at least one host device to the memory device based on the cumulative number of physical blocks previously erased from the flash memory during the time interval; and
(d) resetting by the memory device controller of the memory device the cumulative number of physical blocks previously erased from the flash memory to 0 at the end of the time interval.

17. The non-transitory computer program product of claim 16, wherein adapting the transmission rate based on a cumulative number of physical blocks previously erased comprises lowering the transmission rate if the cumulative number of physical blocks previously erased reaches a threshold over a period of time.

18. The non-transitory computer program product of claim 17, wherein the bus operates at a nominal transmission rate if the cumulative number of memory blocks previously erased from the flash memory remains below the threshold over the period of time, and the memory device controller sets the transmission rate at a transmission rate value lower than the nominal transmission rate if the cumulative number of memory blocks previously erased from the flash memory reaches the threshold over the period of time.

19. The non-transitory computer program product of claim 17, wherein the bus operates at a nominal transmission rate if the cumulative number of memory blocks previously erased from the flash memory remains below a first threshold over the period of time, the memory device controller sets the transmission rate at a first transmission rate value lower than the nominal transmission rate if the cumulative number of memory blocks previously erased from the flash memory reaches the first threshold over the period of time, and the memory device controller sets the transmission rate at a second transmission rate value lower than the first transmission rate value if the cumulative number of memory blocks previously erased from the flash memory reaches a second threshold higher than the first threshold over the period of time.

20. The non-transitory computer program product of claim 16, wherein adapting the transmission rate based on a cumulative number of physical blocks previously erased comprises: configuring by the memory device controller the bus to operate at a nominal transmission rate if the cumulative number of memory blocks previously erased from the flash memory during the time interval is lower than a threshold, and configuring by the memory device controller the bus to operate at a transmission rate value lower than the nominal transmission rate if the cumulative number of memory blocks previously erased from the flash memory during the time interval is higher than the threshold.

21. The non-transitory computer program product of claim 16, wherein adapting the transmission rate based on a cumulative number of physical blocks previously erased comprises: configuring by the memory device controller the bus to operate at a nominal transmission rate if the cumulative number of memory blocks previously erased from the flash memory during the time interval is lower than a first threshold, configuring by the memory device controller the bus to operate at a first transmission rate value lower than the nominal transmission rate if the cumulative number of memory blocks previously erased from the flash memory during the time interval is between the first threshold and a second threshold higher than the first threshold, and configuring by the memory device controller the bus to operate at a second transmission rate value lower than the first transmission rate value if the cumulative number of memory blocks previously erased from the flash memory during the time interval is higher than the second threshold.

22. The non-transitory computer program product of claim 16, wherein the determination of the cumulative number of physical blocks previously erased from the flash memory comprises incrementing the cumulative number of physical blocks previously erased from the flash memory by a count of physical blocks erased transmitted by a flash memory controller of the memory device to the memory device controller, the count of physical blocks erased being calculated by the flash memory controller when the flash memory controller performs erase operations of physical blocks of the flash memory.

23. The non-transitory computer program product of claim 16, wherein steps (b), (c) and (d) are repeated over a plurality of consecutive time intervals.

\* \* \* \* \*